United States Patent
Raley et al.

(10) Patent No.: US 10,049,875 B2
(45) Date of Patent: Aug. 14, 2018

(54) TRIM METHOD FOR PATTERNING DURING VARIOUS STAGES OF AN INTEGRATION SCHEME

(71) Applicant: Tokyo Electron Limited, Minato-ku, Tokyo (JP)

(72) Inventors: Angelique Raley, Halfmoon, NY (US); Akiteru Ko, Schenectady, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/445,042

(22) Filed: Feb. 28, 2017

(65) Prior Publication Data
US 2017/0256395 A1    Sep. 7, 2017

Related U.S. Application Data

(60) Provisional application No. 62/303,928, filed on Mar. 4, 2016.

(51) Int. Cl.
*H01L 21/027* (2006.01)
*H01L 21/66* (2006.01)
*C23C 16/34* (2006.01)

(52) U.S. Cl.
CPC .......... *H01L 21/0273* (2013.01); *C23C 16/34* (2013.01); *H01L 22/12* (2013.01)

(58) Field of Classification Search
None
See application file for complete search history.

(56) References Cited

U.S. PATENT DOCUMENTS 6,107,172 A * 8/2000 Yang ................. H01L 21/32139
                                                    257/E21.314
6,900,139 B1 * 5/2005 Dakshina-Murthy H01L 21/31138
                                                    257/E21.256

(Continued)

FOREIGN PATENT DOCUMENTS

JP    2008-511016 A    4/2008

OTHER PUBLICATIONS

International Search Report and Written Opinion dated Jul. 28, 2017 in PCT/US2017/019961 (14 pages).

*Primary Examiner* — Shamim Ahmed
(74) *Attorney, Agent, or Firm* — Rothwell, Figg, Ernst & Manbeck, P.C.

(57) ABSTRACT

Provided is a method for critical dimension (CD) trimming of a structure pattern in a substrate, the method comprising: providing a substrate in a process chamber of a patterning system, the substrate comprising a first structure pattern and an underlying layer, the underlying layer comprising a silicon anti-reflective coating (SiARC) or a silicon oxynitride (SiON) layer, an optical planarization layer, and a target patterning layer; performing an optional CD trimming process of the first structure pattern; performing a series of processes to open the SiARC or SiON layer and performing additional CD trimming if required; and performing a series of processes to open the optical planarization layer, the series of processes generating a final structure pattern, and performing additional CD trimming if required; wherein the planarization layer is one of a group comprising an advance patterning film (APF), an organic dielectric layer (ODL) or a spin-on hardmask (SOH) layer.

23 Claims, 10 Drawing Sheets

(56) References Cited

U.S. PATENT DOCUMENTS

| | | |
|---|---|---|
| 7,162,133 B2 | 1/2007 | Chang et al. |
| 7,248,773 B2 | 7/2007 | Chang et al. |
| 7,328,418 B2 | 2/2008 | Yamashita et al. |
| 2003/0228532 A1 | 12/2003 | Mui et al. |
| 2006/0037364 A1 | 2/2006 | Chang et al. |
| 2006/0064193 A1* | 3/2006 | Yamashita .............. H01L 22/20 700/121 |
| 2006/0273456 A1* | 12/2006 | Sant .................... H01L 257/734 257/734 |
| 2007/0090089 A1 | 4/2007 | Chang et al. |
| 2008/0045011 A1* | 2/2008 | Fuller ................ H01L 21/0332 438/669 |
| 2008/0230511 A1 | 9/2008 | Kim et al. |
| 2009/0050603 A1* | 2/2009 | Heo .................... H01L 21/0334 216/47 |
| 2009/0286400 A1* | 11/2009 | Heo .................... H01L 21/0273 438/694 |
| 2015/0099367 A1 | 4/2015 | Kim et al. |
| 2015/0243509 A1* | 8/2015 | Chan .................. H01L 29/0649 257/506 |

* cited by examiner

TRIM METHOD FOR PATTERNING DURING VARIOUS STAGES OF AN INTEGRATION SCHEME

CROSS-REFERENCE TO RELATED APPLICATIONS

This application is related to and claims priority to U.S. Provisional Application No. 62/303,928, filed Mar. 4, 2016, the entire contents of which are herein incorporated by reference.

BACKGROUND OF THE INVENTION

Field of Invention

The present invention relates to a system and method for substrate processing, and more particularly to critical dimension trim method for patterning during one or more stages of processing a structure pattern in a substrate.

Description of Related Art

This invention relates to structure patterning using a plasma trimming process. In a typical method of making a pattern on a substrate, a stack of various materials are deposited and the substrate then goes through the lithographic process where resist is coated onto the substrate and exposed to make a pattern. The resist pattern is then transferred to the underlying layers through a succession of plasma steps. To those familiar in the current art, two schemes are commonly used to pattern a substrate. The first scheme involves deposition of optical planarizing layer (OPL), typically a spin-on material followed by deposition of silicon anti-reflective coating (SiARC), also spin-on, followed by resist coating and lithographic processes. In another scheme, deposition of amorphous carbon layer using CVD deposition, SiON film deposition using a CVD process, bottom anti-reflective coating (BARC) deposition where the BARC utilizes a spin-on process, followed by a resist coating and a lithographic process. Control of the critical dimension (CD) throughout the etching of each of these layers is important and several methods/strategies have been used to achieve a final target CD.

There are several possibilities of results regarding the final target CD. The first case is where the final CD target is the same as the printed CD target, meaning the opening of the SiARC/OPL/underlying layers needs to have a 0 bias impact on the CD. The second case is one where the final CD target needs to be smaller than printed CD, a fairly common occurrence as industry is moving to smaller nodes and the EUV process is still currently not at a "manufacturable state". A third case is when the final CD target is too small compared to the printed CD target. A final pattern in the third case may have unacceptable line edge roughness (LER)/line width roughness (LWR) values. In extreme cases, the structure pattern may experience collapse and make the substrate unusable. This invention relates to the second and third cases. Since there are multiple stages in the integration scheme where CD trimming can be done, there is a need for an approach where the final target CD is most likely to be within an acceptable target CD range. Alternatively, a strategy of completing the required CD trimming can also be implemented.

SUMMARY OF THE INVENTION

Provided is a method for critical dimension (CD) trimming of a structure pattern in a substrate, the method comprising: providing a substrate in a process chamber of a patterning system, the substrate comprising a first structure pattern and an underlying layer, the underlying layer comprising a silicon anti-reflective coating (SiARC) or a silicon oxynitride (SiON) layer, an optical planarization layer, and a target patterning layer; performing an optional CD trimming process of the first structure pattern; performing a series of processes to open the SiARC or SiON layer and performing additional CD trimming if required; and performing a series of processes to open the optical planarization layer, the series of processes generating a final structure pattern, and performing additional CD trimming if required; wherein the planarization layer is one of a group comprising an advance patterning film (APF), an organic dielectric layer (ODL) or a spin-on hardmask (SOH) layer.

Also provided is another method for critical dimension (CD) trimming of a structure pattern in a substrate, the method comprising: providing a substrate in a process chamber of a patterning system, the substrate comprising a first structure pattern and an underlying layer, the underlying layer comprising a silicon anti-reflective coating (SiARC) or a silicon oxynitride (SiON) layer, an optical planarization layer, and a target patterning layer; generating a CD trimming strategy of completing a required CD trimming; performing an optional CD trimming process of the first structure pattern if required by the CD trimming strategy; performing a series of processes to open the SiARC or SiON layer and performing additional CD trimming if required by the CD trimming strategy; and performing a series of processes to open the optical planarization layer, the series of processes generating a final structure pattern, and performing additional CD trimming if required by the CD trimming strategy; wherein the planarization layer is one of a group comprising an advance patterning film (APF), an organic dielectric layer (ODL) or a spin-on hardmask (SOH) layer.

The method further comprises concurrently controlling two or more selected operating variables of one or more processes of the group comprising the SiARC/SiON open, the APF/ODL/SOH open, and/or the final transfer process in order to achieve integration objectives; wherein the first structure pattern is a resist pattern generated using a lithography process.

The strategy of completing the required CD trimming can include: CD trimming in any one or any two or all three stages where CD trimming can be performed; and/or use of a fixed or variable flowrate of a CD trimming gas; and/or use of a fixed or variable length of time of exposure to the CD trimming gas. Online in situ metrology devices measuring a current CD width of the first or final structure pattern and adjusting the trimming gas flowrate or length of time of exposure to the CD trimming gas based on a comparison of the current CD width to the target CD trimming width can be performed.

BRIEF DESCRIPTION OF THE DRAWINGS

The accompanying drawings, which are incorporated in and constitute a part of this specification, illustrate embodiments of the invention and, together with the general description of the invention given above, and the detailed description given below, serve to describe the invention.

DETAILED DESCRIPTION OF EMBODIMENTS OF THE INVENTION

Figure 1:
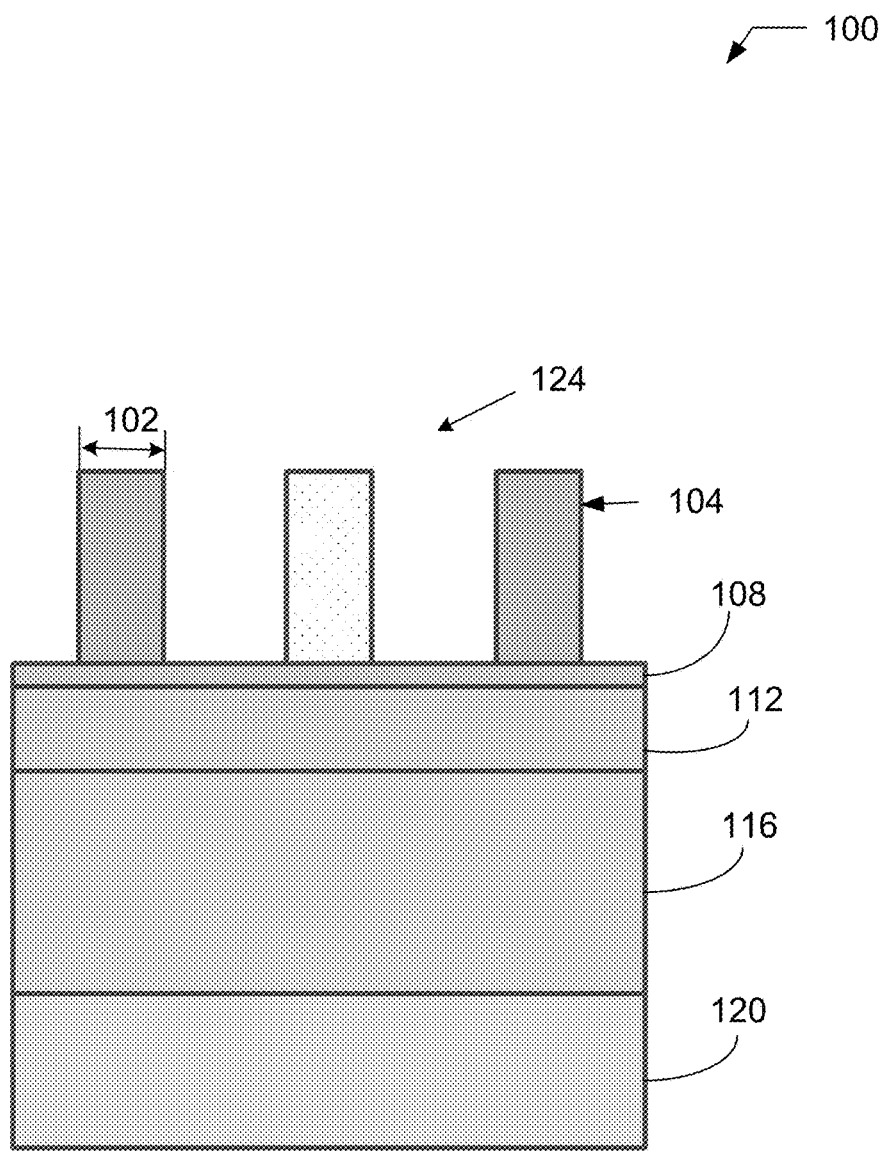
FIG. 1 depicts an exemplary starting structure pattern in a substrate containing the layers used in a typical lithographic stack and critical dimension (CD) trimming patterning process.

Methods and systems for patterning sidewall shapes are presented. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale. In referencing the figures, like numerals refer to like parts throughout.

Reference throughout this specification to "one embodiment" or "an embodiment" or variation thereof means that a particular feature, structure pattern, material, or characteristic described in connection with the embodiment is included in at least one embodiment of the invention, but does not denote that they are present in every embodiment. Thus, the appearances of the phrases such as "in one embodiment" or "in an embodiment" in various places throughout this specification are not necessarily referring to the same embodiment of the invention. Furthermore, the particular features, structure patterns, materials, or characteristics may be combined in any suitable manner in one or more embodiments. Various additional layers and/or structure patterns may be included and/or described features may be omitted in other embodiments.

Additionally, it is to be understood that "a" or "an" may mean "one or more" unless explicitly stated otherwise.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

As used herein, the term "substrate" means and includes a base material or construction upon which materials are formed. It will be appreciated that the substrate may include a single material, a plurality of layers of different materials, a layer or layers having regions of different materials or different structure patterns in them, etc. These materials may include semiconductors, insulators, conductors, or combinations thereof. For example, the substrate may be a semiconductor substrate, a base semiconductor layer on a supporting structure pattern, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon substrates, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Referring now to the drawings, where like reference numerals designate identical or corresponding parts throughout the several views.

Figure 2A:
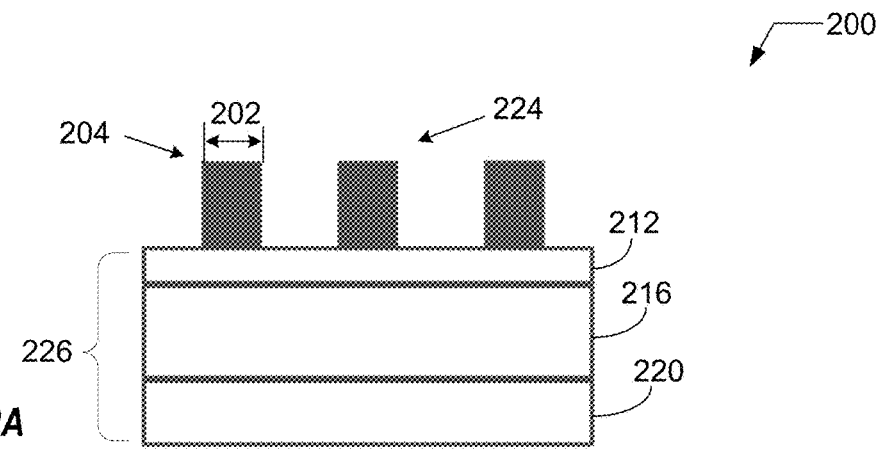
FIG. 2A depicts a structure pattern at a starting point of a CD transfer patterning process.

FIG. 1 depicts an exemplary schematic 100 starting structure pattern 104 in a substrate 124 containing the layers used in a typical lithographic stack and critical dimension (CD) transfer patterning process. The top layer is typically a resist that have been patterned using known lithography processes such as resist structure pattern 104 on the substrate 124 with a CD width 102. An additional organic bottom anti-reflective coating (BARC) 108 may be used in conjunction with a chemical vapor deposition (CVD) stack. BARC thickness can vary from 9 nm to 50 nm. The BARC 108 is not needed for a spin-on SiARC/OPL film integration scheme. The next layer down can be a silicon oxynitride (SiON) applied using a CVD process, SiARC applied using a spin-on process, or a bottom anti-reflective film 112. The next layer down can be a planarization layer 116 which can either be a spin—on such as an ODL, OPL, or SOH or applied as a CVD such as APF, which is mostly an amorphous carbon film. The next layer down is the target patterning layer 120. FIG. 2A depicts a schematic 200 of a resist structure pattern 204 at a starting point of a CD trimming patterning process of a substrate 224, where the resist structure pattern 204 is on top of the underlying layer 226 starting with the SiON or SiARC layer 212. Further, the SiON or SiARC layer 212 is on top of the planarization layer 216, that can comprise an ODL, OPL, or SOH layer or applied as a CVD such as APF, which is typically an amorphous carbon film. The target patterning layer 220 is the next layer of the underlying layer 226 of the substrate 224. Often, CD trimming is needed to target smaller final CD transfer into the target patterning layer 220. CD trimming can be performed at one or more stages in the integration scheme. The first stage where CD trimming can be done in the integration scheme is after the resist structure pattern 204 is generated, in this case, in a previous lithography process, (not shown). The resist structure pattern 204 on the substrate 224 has a CD width 202 that may be bigger than the required CD width for the application at this stage of the integration scheme. CD trimming can be performed prior to transferring CD into SiARC or SiON layer. The second stage is during or after SiON or SiARC open process. The third stage is during or after the APF or ODL or SOH open process.

Figure 2B:
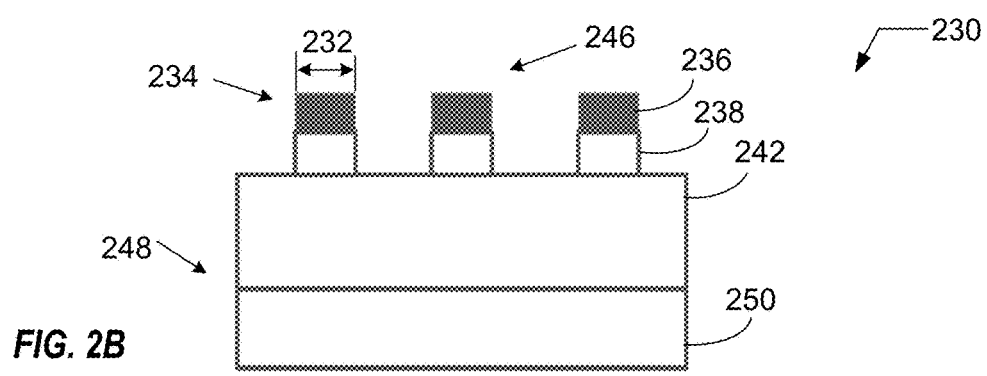
FIG. 2B depicts a structure pattern of a CD patterning process post silicon oxynitride (SiON) or silicon anti-reflective coating (SiARC) open process.

FIG. 2B depicts a schematic 230 of a structure pattern 234 of a CD patterning process during or after silicon oxynitride (SiON) or silicon anti-reflective coating (SiARC) open process. The substrate 246 comprises a structure pattern 234 with a CD width 232 where the structure pattern 234 includes a resist portion 236 and a SiON or SiARC portion 238. The planarization layer 242, comprising an ODL, OPL, or SOH layer or applied as a CVD such as APF is the next layer. Below the planarization layer 242 is the target patterning layer 250, the next layer of the underlying layer 248 of the substrate 246. If there is a need for more trimming, the structure pattern 246 having a CD width 232 which can be trimmed during or after the SiON or SiARC open process. The determination whether CD trimming is required is done by comparing the current CD width to the target CD width. The current target width can be obtained by using metrology data measured with in situ online metrology devices, discussed further below.

Figure 2C:
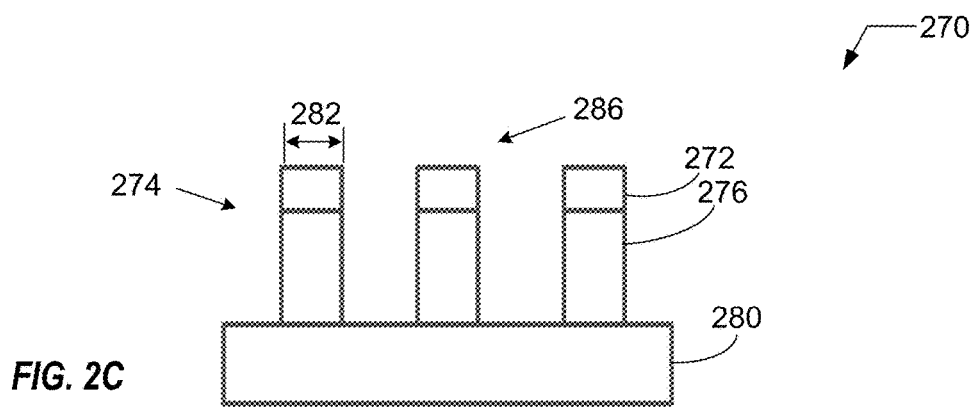
FIG. 2C depicts a structure pattern of a CD patterning process after an advanced patterning film (APF), organic dielectric layer (ODL) or spin-on hardmask (SOH) open process.

FIG. 2C depicts a schematic 270 of a structure pattern 274 of a substrate 286 in a CD patterning process post advanced patterning film (APF), organic dielectric layer (ODL) or spin-on hardmask (SOH) open process. The structure pattern 274 having a CD width 282 comprises a SiON/SiARC portion 272, an ODL/OPL/SOH portion 276 after the APF, ODL, or SOH open process, and the target patterning layer 280. If there is a need for more CD trimming, the structure pattern 274 can be trimmed during or after the APF, ODL, or SOH open process. As mentioned above, the determination whether CD trimming is required is done by comparing the current CD width to the target CD width.

In one embodiment, the final CD targeting/trim amount can be achieved using any combinations of CD trimming methods in the one or more stages mentioned above. Specifically, metrology steps can be performed to determine if more CD trimming is needed. The CD trimming can be done during or after the opening of the structure pattern layer or at a later step of the integration scheme.

Figure 3A:
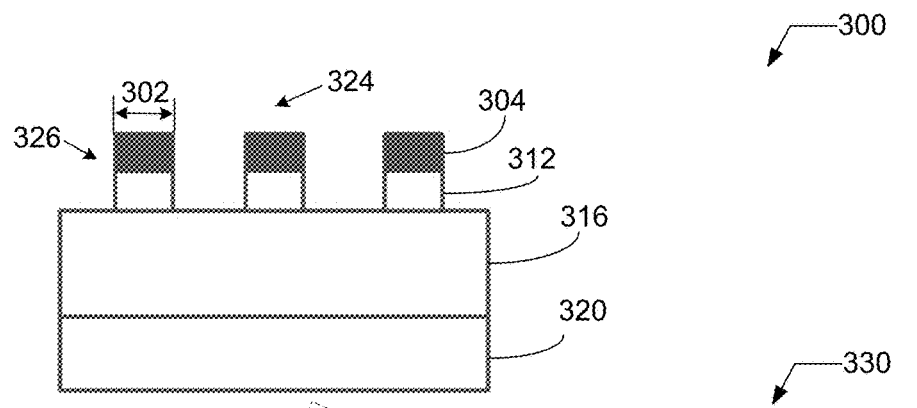
FIG. 3A depicts a starting structure pattern of a CD patterning process prior to generation of a planarization pattern.

FIG. 3A depicts a schematic 300 of a starting structure pattern 326 of a substrate 324 in a CD patterning process prior to processing of the planarization layer 316. The resist structure portion 304, having a CD width 302, is on top of the SiON or SiARC pattern structure 312. Furthermore, the SiON or SiARC pattern structure 312 is on top of the planarization layer 316, comprising an ODL, OPL, or SOH layer or applied as a CVD such as APF. Below the planarization layer 316 is the target patterning layer 320, the next layer of the underlying layer of the substrate 324. If there is a need for more trimming, the structure pattern 326 can be trimmed during or after the APF, ODL, or SOH open process.

Figure 3B:
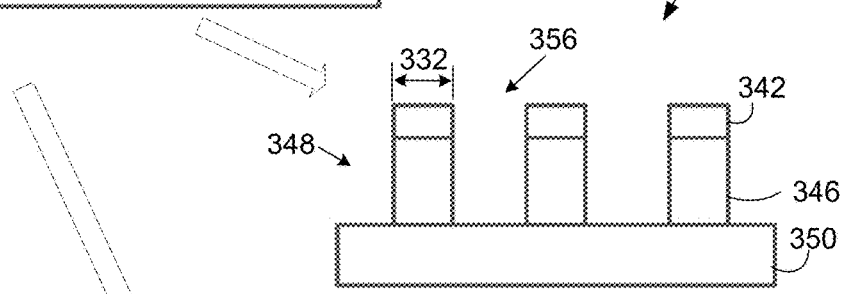
FIG. 3B depicts a planarization pattern using selective chemistry to a SiARC or SiON layer where no CD trim is done.

FIG. 3B depicts a schematic 330 of a structure pattern 348 in a substrate 356 processed with a CD width 332 using selective chemistry where no further CD trimming needs to be done. The structure pattern 348, having a CD width 332, comprises a SiON or SiARC portion 342. Furthermore, the SiON or SiARC layer 342 is on top of the planarization layer portion 346, comprising an ODL, OPL, or SOH layer or applied as a CVD such as APF. Below the structure pattern 348 is the target patterning layer 350, the next layer of the underlying layer of the substrate 356. In this embodiment, there is no need for more CD trimming, as the amount of trimming in the previous trimming step(s) were considered sufficient to meet the needs of the patterning application. The CD width 332 is at the desired target CD width in this stage of the integration scheme.

Figure 3C:
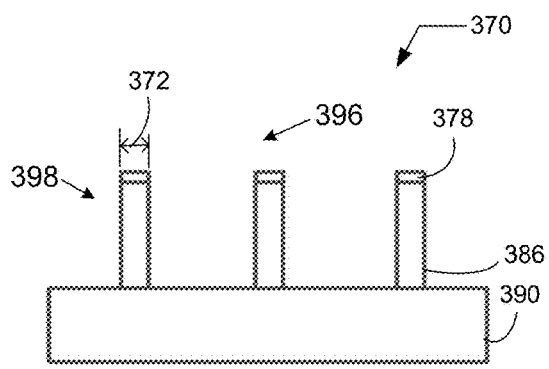
FIG. 3C depicts a planarization pattern using selective chemistry where a controlled amount of fluorocarbon gas is used to trim the SiARC or SiON layer as the planarization layer is opened.

FIG. 3C depicts a schematic 370 of a structure pattern 398 in substrate 396 using selective chemistry where a controlled amount of fluorocarbon gas is used to trim the structure pattern 398 while or after the planarization layer is opened. The structure pattern 398, having a CD width 372, comprises a SiARC or SION portion 378 and planarization layer portion 386, comprising an ODL, OPL, or SOH layer or applied as a CVD such as APF, typically an amorphous carbon film. Below the planarization layer is the target patterning layer 390 of the substrate 396. In this embodiment, there is a need for more CD trimming, as the amount of trimming in the previous step was considered insufficient to meet the needs of the patterning application. The use of the fluorocarbon gas can be done during or after the open process. Operation variables such the flow rate of the fluorocarbon gas and length of time the fluorocarbon gas is turned on controls the amount of CD trimming done in this step.

Figure 4A:
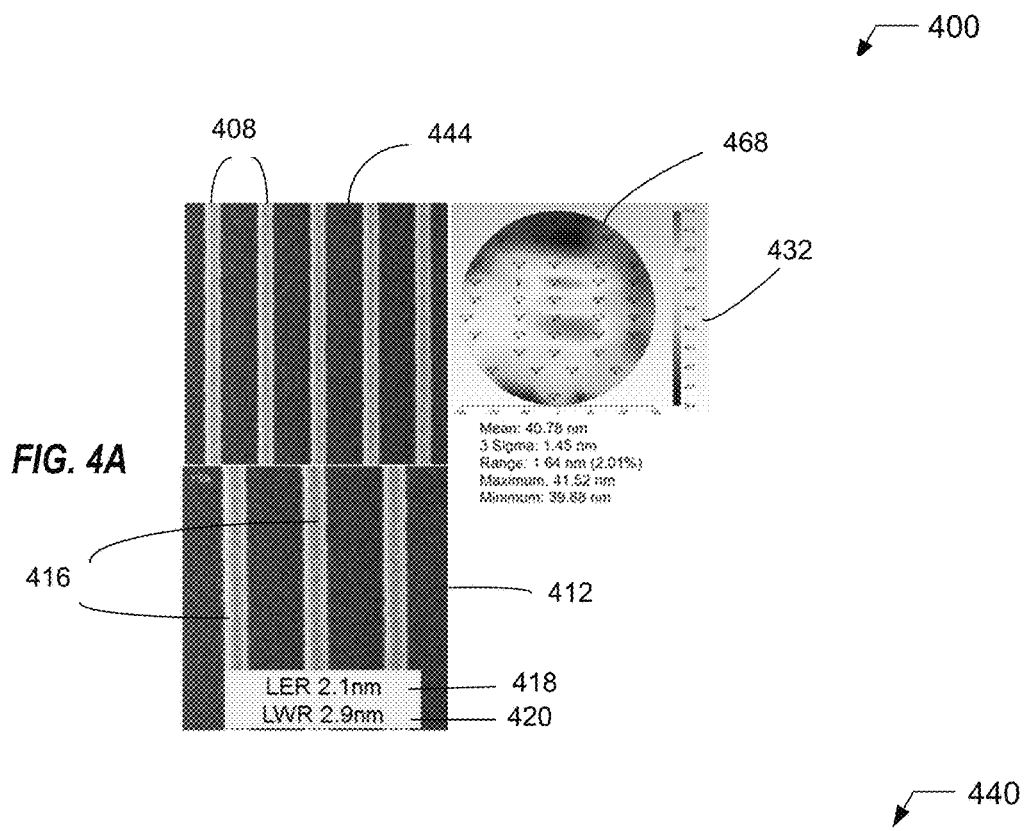
FIG. 4A depicts two top-view images and a CD-width distribution graph on the substrate after a CD trim process at an APF open step using CO2/Ar and C4F8 chemistry.

FIG. 4A depicts top-view images 400 showing lines 408 and 416 and a CD-width distribution graph 432 on a substrate 468 after a CD trim process at an APF open process using CO2/Ar only chemistry. The two line/space top-view images comprise: (1) top image 444 of the line/space structure pattern in a substrate where CO2 and Ar are the only chemicals used during the APF open process and (2) bottom image 412 of a close up of the same line/space structure pattern in a substrate showing the line edge roughness (LER) of 2.1 nm 418, and line width roughness (LWR) of 2.9 nm 420. The CD width distribution graph 432 is a distribution of CD width around the substrate 468 and where the mean CD width is 40.78 nm, with a 3-sigma of 1.45 nm, the range of the CD width is from 39.88 to 141.52 nm, with a range of 1.64 nm or 2.01%. As can be seen in the CD width distribution graph 432, distribution of CD widths is in a very small range with a small 3-sigma and the lines of the structure patterns are well defined and have good LER/LWR numbers.

Figure 4B:
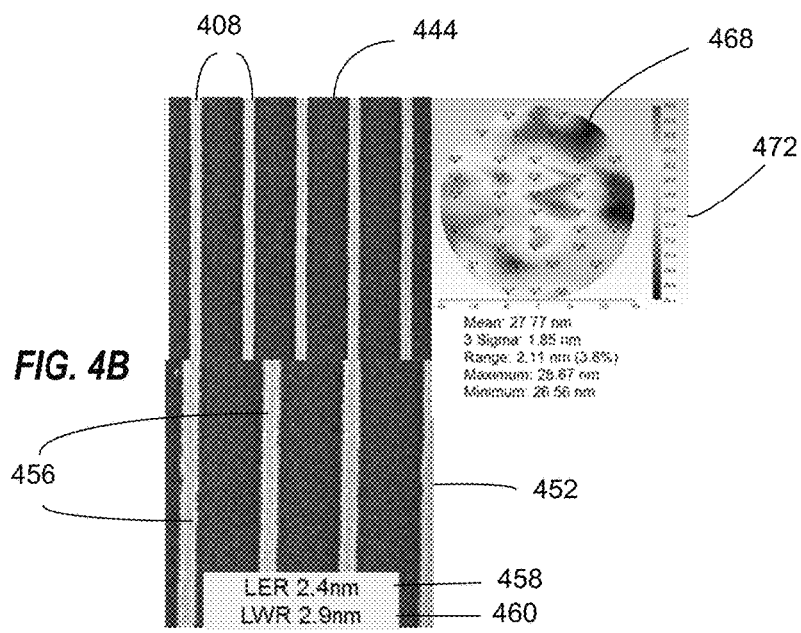
FIG. 4B depicts two top-view images and a CD-width distribution graph on the substrate after a CD trim process at an APF open step using CO2/Ar only chemistry.

FIG. 4B depicts top-view images 440 showing lines 408 and 456 and a CD-width distribution graph on the substrate 468 after a CD trim process at an APF open step using CO2/Ar and C4F8 chemistry. The two top-view line/space images comprise: (1) top image 444 of the line/space structure pattern in a substrate where CO2 and Ar are the only chemicals used during the APF open process and (2) bottom image 452 of a close up of the same line/space structure pattern in a substrate showing the line edge roughness (LER) of 2.4 nm 458, and line width roughness (LWR) of 2.9 nm 460. The shade distribution of graph 472 is a distribution of CD width around the substrate 468 and where the mean CD width is 27.77 nm, with a 3-sigma of 1.85 nm, the range of the CD width is from 26.56 to 28.67 nm, with a range of 2.11 nm or 3.80%. Similar to FIG. 4A, the CD width distribution graph 472, distribution of CD widths is in a very small range with a small 3-sigma and the lines of the structure patterns are well defined and have good LER/LWR numbers.

Figure 5A:
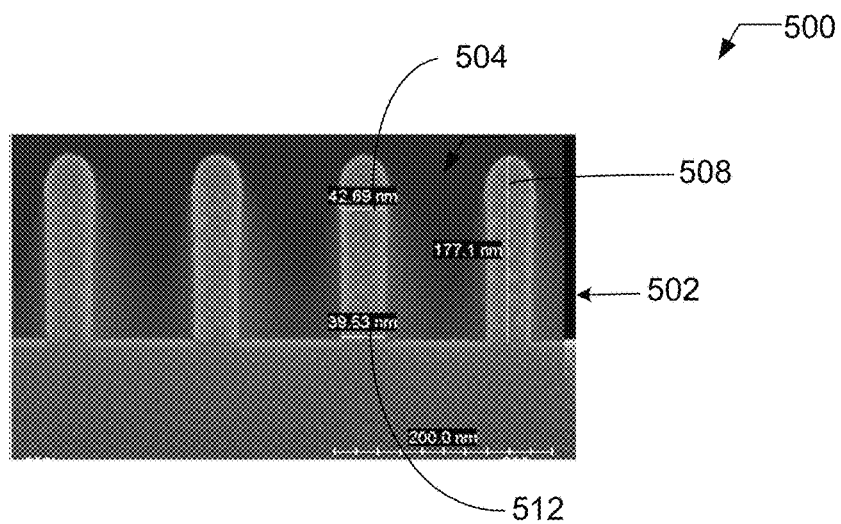
FIG. 5A depicts a side-view image of the structure patterns using an X-SEM profiler image after a trim demonstration for a flow rate of AR/CO2.
Figure 5B:
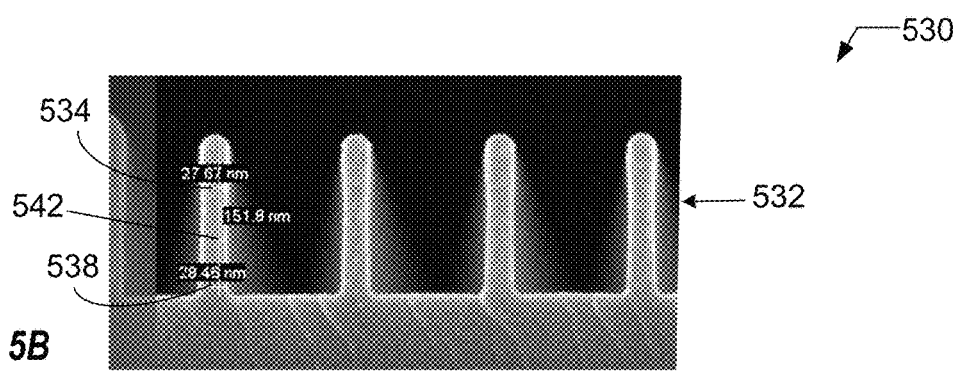
FIG. 5B depicts a side-view image of the structure patterns using a X-SEM profiler image after a trim demonstration for varying flow rates of AR/CO2/C4F8.
Figure 5C:
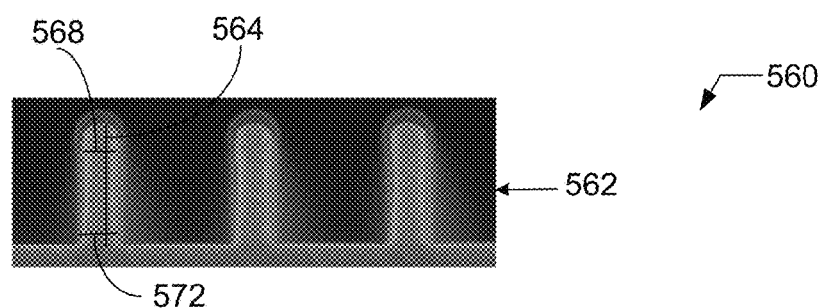
FIG. 5C depicts a side-view image of the structure patterns using an X-SEM profiler image after a trim demonstration for a total etch time of 65 seconds.

FIG. 5A, FIG. 5B, and FIG. 5C depict the differences due to use or non-use of further CD trimming in the integration scheme and the effect of longer time of exposure of the structure pattern to fluorocarbon gas in the APF open process. FIG. 5A depicts a side-view image 500 of the structure pattern 502 using a cross section scanning electron microscope (X-SEM) profiler image in the base case where further CD trimming was not yet performed. The structure pattern 502 for this case includes a structure with a top CD 504 of 42.69 nm, a bottom CD 512 of 39.53 nm, and a CD height 508 of 177.1 nm. The structure pattern 502 is the result of a flowrate of 400 sccm Ar and 180 sccm CO2.

FIG. 5B depicts a side-view image 530 of the structure pattern 532 using an X-SEM profiler image after a trim demonstration. The structure pattern 532 for this case includes a structure with a top CD 534 of 27.67 nm, a bottom CD 538 of 28.46 nm, and a CD height 542 of 151.8 nm. The structure pattern 532 is the result of a flowrate of 400 sccm Ar, 180 sccm CO2, and 3 sccm of C4F8.

FIG. 5C depicts a side-view image 560 of the structure pattern 562 using a X-SEM profiler image after a trim demonstration for a total etch time of 65 seconds. The structure pattern 562 includes a structure with a top CD 568, a bottom CD 572, and a CD height 564. The structure pattern 562 is the result of a flowrate of 400 sccm Ar, 180 sccm CO2, and 3 sccm of C4F8 for the duration of entire length of the APF open process. As can be seen in the images of the structure pattern in FIG. 5B and FIG. 5C, CD trimming of the structure patterns is a function of the flowrate and length of exposure of the structure patterns to the CD slimming gas. Thus, the flowrate of the individual gases of the gas mixture and the duration of the exposure of the structure pattern must be tightly controlled in order to get the target results of the integration scheme.

Figure 6A:
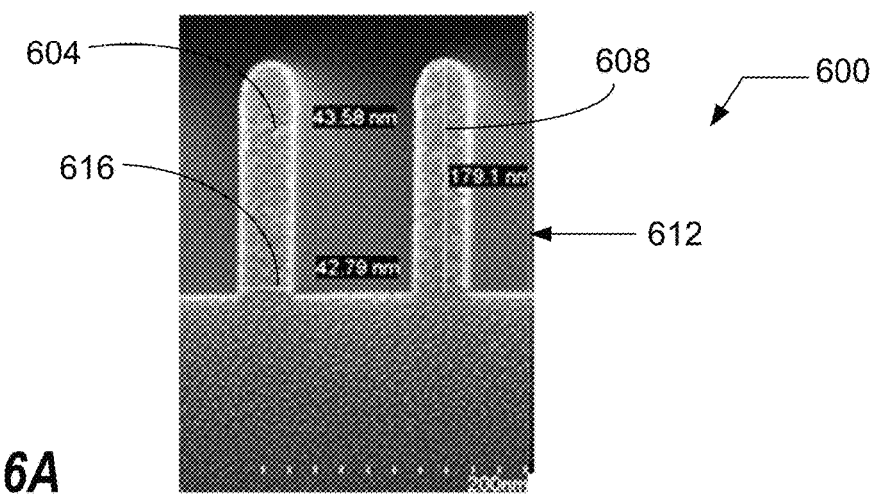
FIG. 6A depicts a side-view image of the structure pattern where no C4F8 was used in the APF open etch process.
Figure 6B:
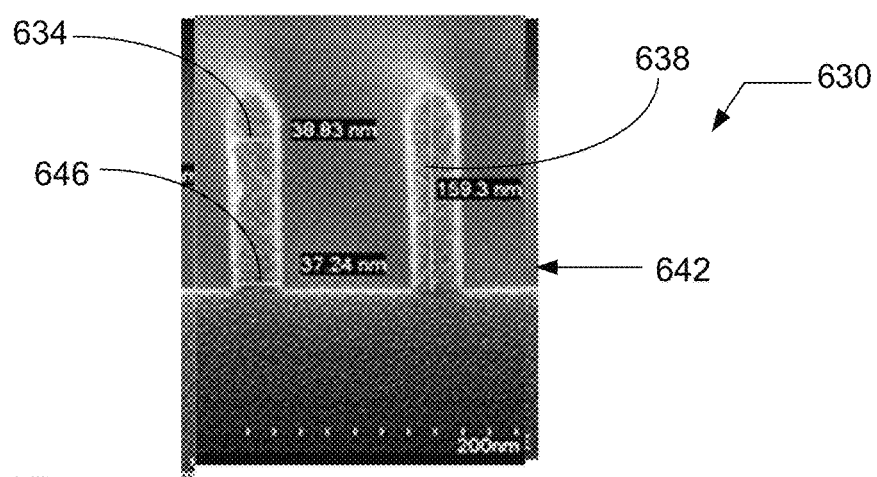
FIG. 6B depicts a side-view image of the structure pattern where C4F8 was used for the first 15 seconds of the APF open etch process.
Figure 6C:
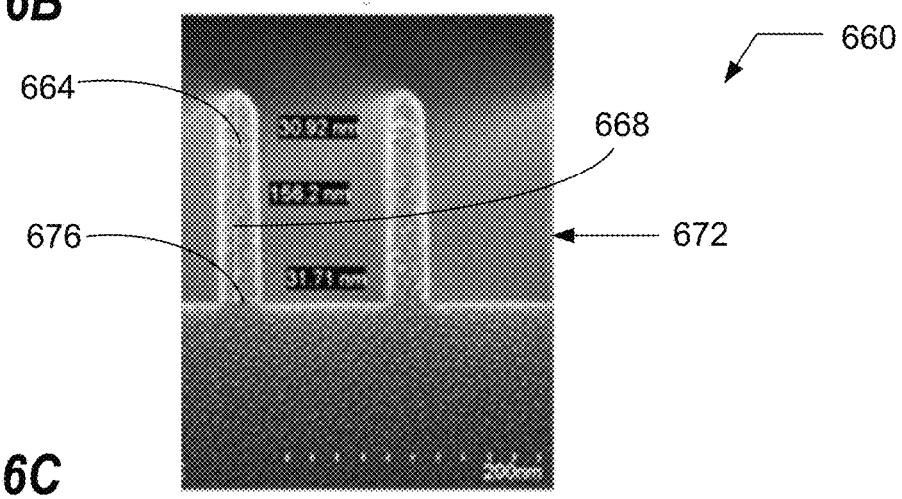
FIG. 6C depicts a side-view image of the structure pattern where C4F8 was used in the first 30 seconds of the APF open etch process.

FIG. 6A, FIG. 6B, and FIG. 6C depict structure pattern images in another test to measure the effect of exposure time to the CD width and CD height. FIG. 6A depicts a side-view image 600 of the structure pattern 612 where no C4F8 was used in the APF open process. The structure pattern 612 for this base case includes top CD 604 of 43.58 nm, a bottom CD 616 of 42.79 nm, and a CD height 608 of 179.1 nm.

FIG. 6B depicts a side-view image 630 of the structure pattern 642 where C4F8 was used for the first 15 seconds of the APF open process. The structure pattern 642 for this base case includes a top CD 634 of 38.83 nm, a bottom CD 646 of 37.24 nm, and a CD height 638 of 159.3 nm.

FIG. 6C depicts a side-view image 660 of the structure pattern 672 where C4F8 was used in the first 30 seconds of the APF open process. The structure pattern 672 for this case includes top CD 664 of 30.92 nm, a bottom CD 676 of 31.71 nm, and a CD height 668 of 156.2 nm. As mentioned above, CD trimming of the structure pattern is a function of the length of exposure of the structure pattern to the CD slimming gas. As above, the flowrate of the individual gases of the gas mixture and the duration of the exposure of the structure pattern must be tightly controlled in order to get the required results of the integration scheme.

Figure 7:
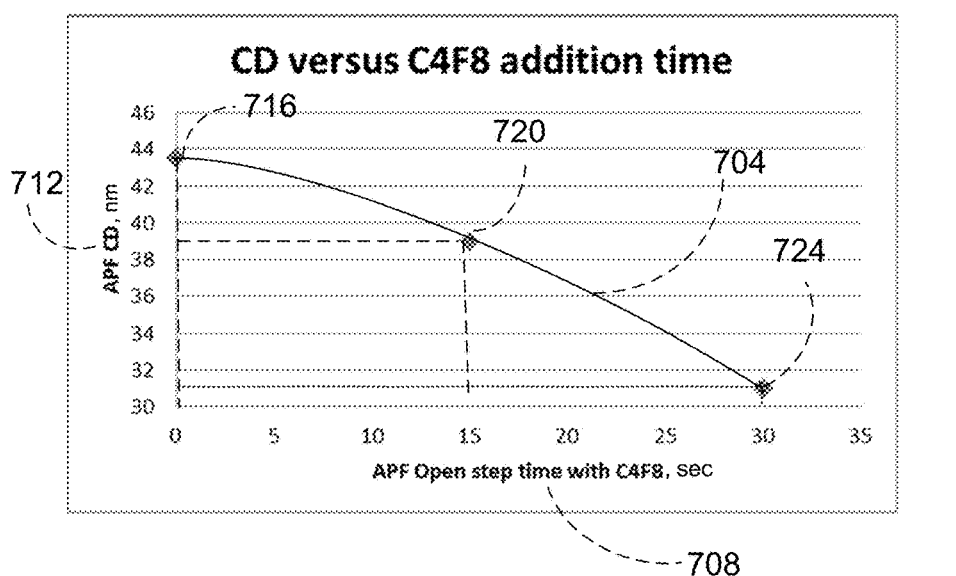
FIG. 7 is a graph of the APF CD as a function of the APF Open step time with C4F8.

FIG. 7 is a graph 700 of the APF CD as a function of the APF open step time with C4F8. The X-axis 708 represents the APF open step time with the C4F8 in seconds while the Y-axis 712 represents the APF CD in nm. The curve 704 is a slightly down-sloping curve where the first data point 716 represents a zero time with C4F8 and the value of the APF CD is about 43.5 nm; a second data point 720 represents 15 seconds of open step time with C4F8 and the value of the APF CD is about 39.5 nm; and third data point 724 represents a 30 seconds of open step time with C4F8 and the value of the APF CD is about 31.0 nm. CD trim amount during APF open can be modulated by time during which C4F8 gas is added during the APF open process or by total amount of C4F8 added the during entire step. The graph provides proof of CD modulation from 43.5 nm down to 31.0 nm by increasing the C4F8 addition time.

Figure 8A:
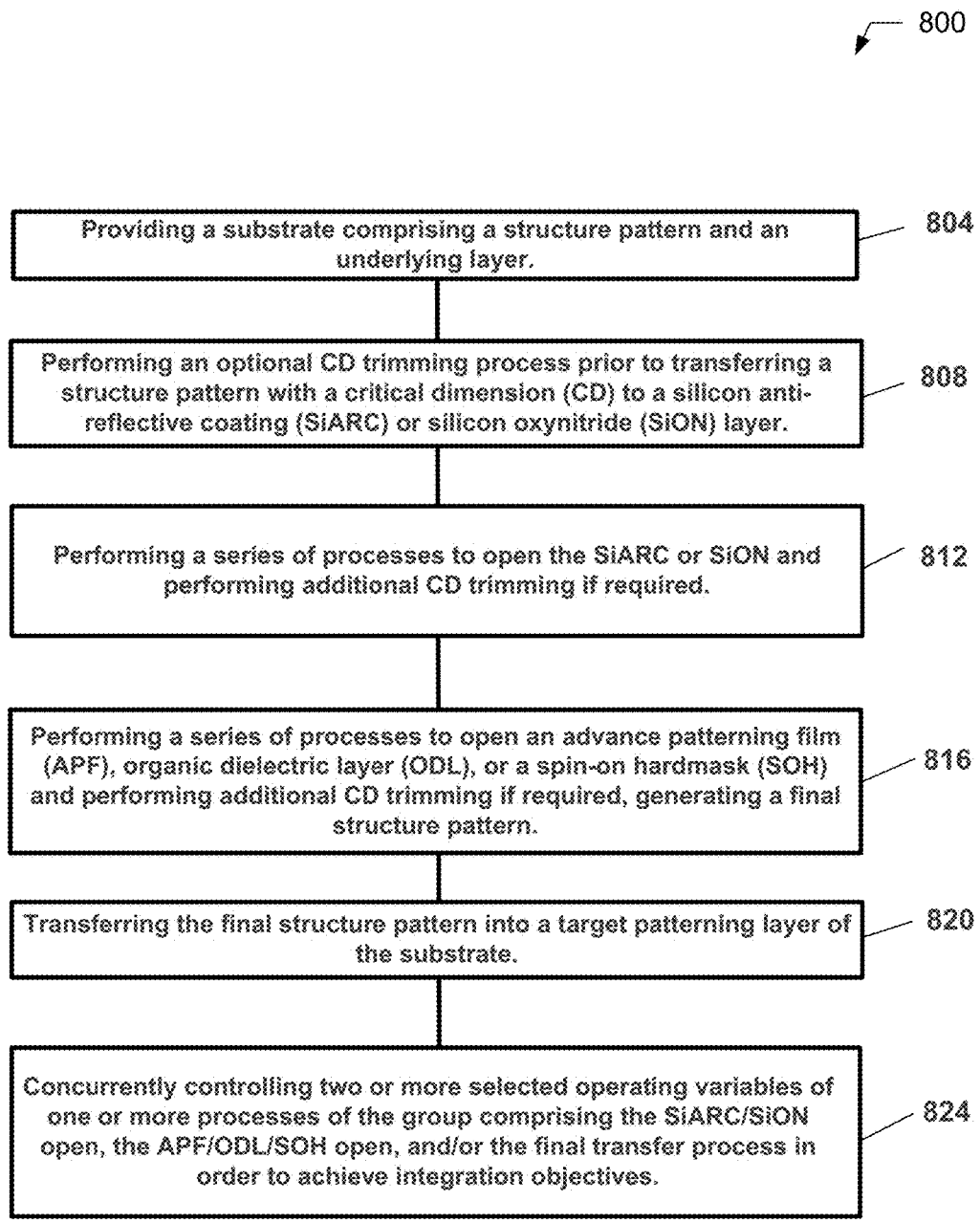
FIG. 8A is an exemplary process flow chart of the method of performing the structure pattern CD trimming process in several stages of the integration scheme.

FIG. 8A is an exemplary process flow chart 800 of the method of performing the structure pattern CD trimming process in several stages of the integration scheme. In operation 804, a substrate comprising a structure pattern, typically a resist structure pattern, and an underlying layer is provided in a processing chamber of a CD trimming system. The underlying layer comprises a SiON or SiARC layer. Furthermore, the SiON or SiARC layer is on top of a planarization layer, comprising an ODL, OPL, or SOH layer or applied as a CVD such as APF, which is typically an amorphous carbon film. Below the planarization layer is the target patterning layer.

In operation 808, an optional CD trimming process is performed prior to transfer of a structure pattern with a critical dimension (CD) to a silicon anti-reflective coating (SiARC) or silicon oxynitride (SiON) layer. Determination to perform this step is based on the requirements of the application using empirical and historical data as a guide. In operation 812, a series of processes is performed to open the SiARC or SiON layer and to perform additional CD trimming if required. The technology involved in the series of processes to open the SiARC or SiON layer is known to people in the art and will not be discussed here.

In operation 816, performing a series of processes to open an advance patterning film (APF), an organic dielectric layer (ODL), or a spin-on hardmask (SOH) and performing additional CD trimming if required, generating a final structure pattern. Typical chemistries to etch APF or OPL commonly use a mixture of O2 and CO2 which act as the radical source to chemically remove the organic layer combined with a diluent gas such as Ar or He which provide ion/physical component of the etch. Depending on the application, other chemistries can also be used. Sometimes a passivant gas to protect the sidewall of the organic layer being opened is used; examples of passivant gas include HBr or COS or the like. For the most part these chemistries are selective to the SiON or SiARC mask remaining and little to no CD trimming is obtained during the opening of the OPL or APF.

The determination whether CD trimming is required in operation 816 is done by comparing the current CD width to the target CD width. The current target width can be obtained by using metrology data measured with in situ online metrology devices. Metrology devices can include optical metrology devices that use broadband beams such as reflectometers, spectrometers, ellipsometers, or devices that use laser beams. Other devices such as optical emission spectroscopy (OES) and other sensors and monitors can also be used. To perform the CD trimming, a small controlled amount of CxFy gas is added to the commonly used CO2 or O2/Ar mixture to trim the SiON or SiARC mask remaining whilst patterning the OPL/APF. This amount can be added for the full length of the etching step for maximum trim capability or can be added only during a decided time to control the trim amount achieved in this operation. For example in a dual CCP chamber, a mixture of 180 sccm of CO2 with 400 sccm of Ar can be used to pattern an APF layer with a vertical profile and no CD trim from incoming SiON CD. For example, if 3 sccm of CxFy is added during the opening of the APF layer to this chemistry, a trim of over 9 nm can be obtained. Typically, the CxFy used is C4F8.

In operation 820, the final pattern is transferred into the target patterning layer of the substrate. In operation 824, two or more selected operating variables of one or more processes of the group comprising the SiARC/SiON open, the APF/ODL/SOH open, and/or the final pattern transfer process are concurrently controlled in order to achieve integration objectives.

The integration objectives can include a target CD trimming width, target LER, target LWR, target substrate throughput, and target cost of ownership. The two or more selected operating variables can include flowrate of the fluorocarbon gas, length of time of fluorocarbon gas exposure, chamber pressure, chamber temperature, and stages where CD trimming is performed.

The inventors found out that the CD trimming during or after the APF/ODL/SOH open process provided unexpected positive results, including great LER and LWR, a good 3 sigma range, and a small percentage range between the minimum and the maximum CD. The CD was trimmed all the way down to 13 nm. With tighter controls of the two or more selected operating variables, the inventors also found out that CD's can be trimmed to 9 nm or lower.

Figure 8B:
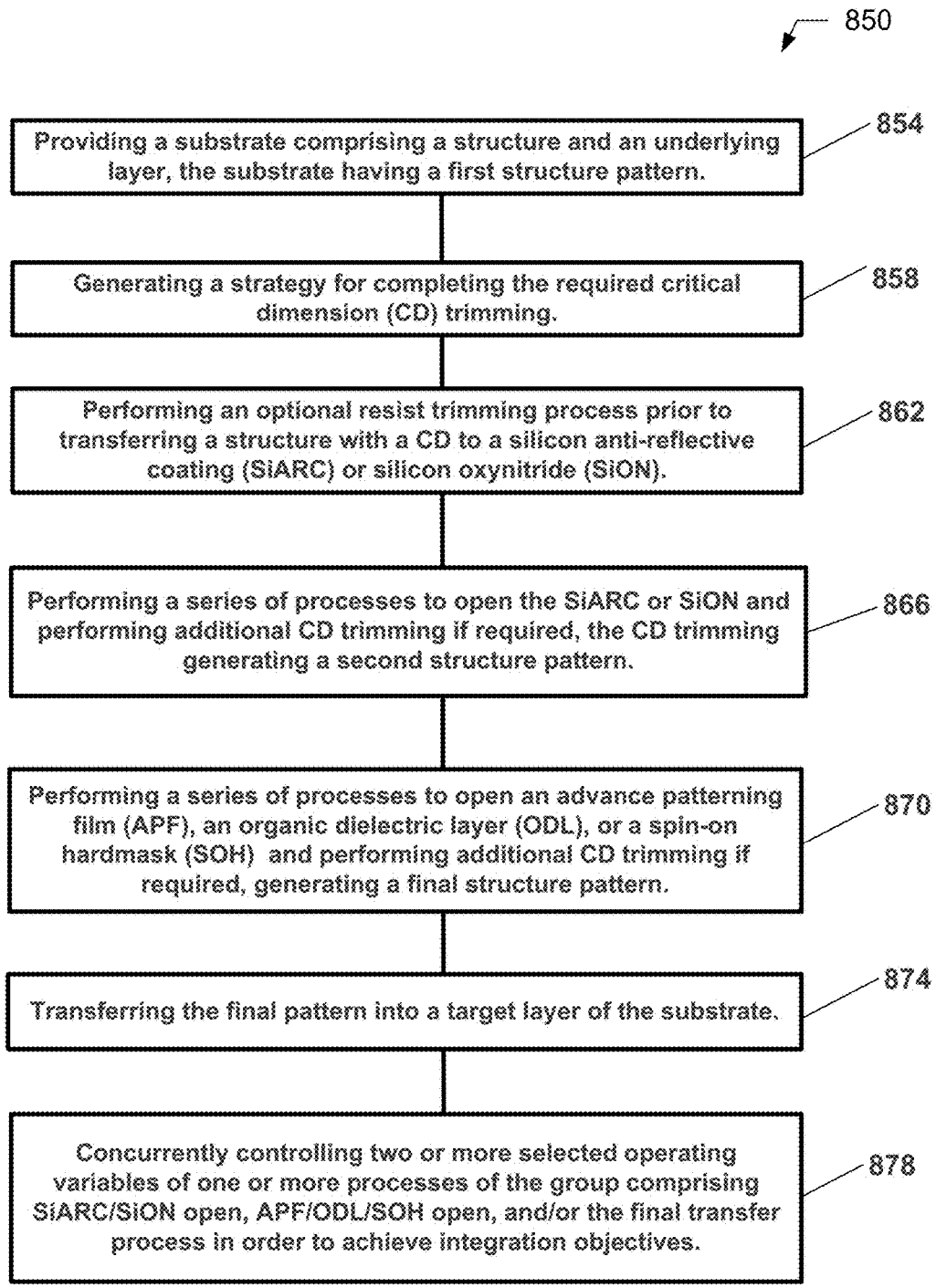
FIG. 8B is an exemplary process flow chart of the method of performing the structure pattern trimming process in one or more stages of the integration scheme using a selected CD trimming strategy.

FIG. 8B is an exemplary process flow chart 850 of the method of performing the structure pattern trimming process in one or more stages of the integration scheme using a selected CD trimming strategy. Many of the operations in FIG. 8B are similar to the same operations described in connection with FIG. 8A. The differences will be highlighted in the description that follows. In operation 854, a substrate comprising a structure pattern and an underlying layer is provided in a processing chamber of a CD trimming system. The underlying layer comprises a SiON or SiARC layer. Furthermore, the SiON or SiARC layer is on top of a planarization layer, comprising an ODL, OPL, or SOH layer or applied as a CVD such as APF, which is typically an amorphous carbon film. Below the planarization layer is the target patterning layer, the next layer of the underlying layer of the substrate. If there is a need for more CD trimming, the structure pattern can be trimmed in one or more stages of the integration scheme discussed below.

In operation 858, a CD trimming strategy for completing the required CD trimming is generated or selected from a set of CD trimming strategies prepared based on empirical data for the application. This is a new step that has no equivalent in FIG. 8A. The three stages or points in the integration scheme where CD trimming can be performed include (1) a first stage occurring after the resist lithography process generating the first structure pattern, (2) a second stage occurring during or after the SiARC/SiON open and/or (3) a third stage occurring during or after the SiON APF/ODL/SOH open processes. The strategy can include CD trimming in any one, any two, all of the three stages in the integration scheme where CD trimming can be performed. In addition, the strategy can include using a fixed or variable flow rate of the etchant trimming gas or gas mixture, using a fixed or a variable length of time of exposure of the etchant trimming gas to the structure pattern being trimmed.

Furthermore, a CD trimming strategy including a variable flow rate of the etchant trimming gas and/or a variable length of time exposure would create a need for inline metrology devices, sensors and/or monitors that can measure the critical dimensions of the structure pattern on line and in situ, i.e., while the operation is ongoing. As a first example, the CD trimming strategy may include the choice of CD trimming during the SiARC/SiON open and during the SiON APF/ODL/SOH open process, fixed flowrate of 2-5 sccm C4F8, variable time, and use of online in situ metrology data. A second example may include CD trimming in all 3 stages, using a variable flowrate of the CD trimming gas, and using a variable length of exposure time with the use of online metrology data to adjust the flow rate and length of exposure time with the assistance of a controller. In a third example, the CD trimming strategy is implemented by programming a series of control algorithms in a controller coupled to the CD trimming system. In yet another example, the CD trimming strategy can use one or more of the stages for CD trimming and use fixed flowrates of the CD trimming gas and fixed length of time exposure to the CD trimming gas derived from empirical data for the application.

In operation 862, an optional resist trimming process is performed prior to transfer of a structure pattern with a critical dimension (CD) to a silicon anti-reflective coating (SiARC) or silicon oxynitride (SiON) if required by the selected CD stripping strategy. In operation 812, a series of processes is performed to open the SiARC or SiON and to perform additional CD trimming if required by the selected CD stripping strategy.

In operation 866, a series of processes to open the SiARC or SiON performed and to perform additional CD trimming if required by the selected CD trimming strategy. In operation 870, performing a series of processes to open an advance patterning film (APF), an organic dielectric layer (ODL), or a spin-on hardmask (SOH) and performing additional CD trimming if required, generating a final structure pattern. In operation 874, the final pattern is transferred into the target patterning layer of the substrate. In operation 878, two or more selected operating variables of one or more processes of the group comprising the SiARC/SiON open, the APF/ODL/SOH open, and/or the final transfer process are concurrently controlled in order to achieve integration objectives.

As mentioned above, the integration objectives can include a target CD trimming width, target LER, target LWR, target substrate throughput, and target cost of ownership. The two or more selected operating variables can include flowrate of the fluorocarbon gas, length of time of fluorocarbon gas exposure, chamber pressure, chamber temperature, and number operation or processes where CD trimming is performed.

Figure 9:
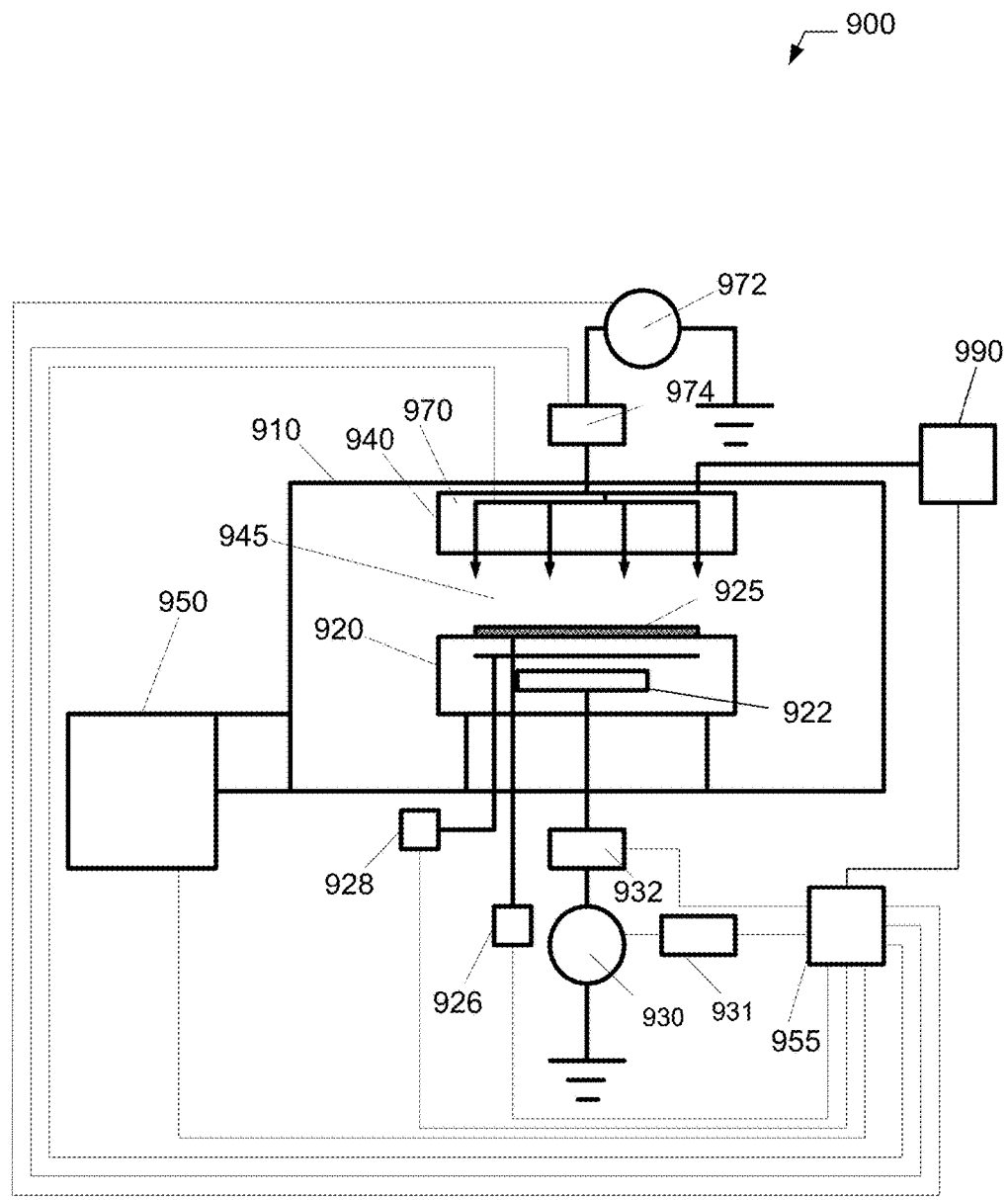
FIG. 9 is an exemplary systems chart for controlling the performance of the structure pattern trimming in an embodiment of the present invention.

FIG. 9 is an exemplary systems chart for controlling the performance of the structure pattern trimming in an embodiment of the present invention. A plasma etching system 900 configured to perform the above identified process conditions comprising a plasma processing chamber 910, substrate holder 920, upon which a substrate 925 to be processed is affixed, and vacuum pumping system 950. Substrate 925 can be a semiconductor substrate, a substrate, a flat panel display, or a liquid crystal display. Plasma processing chamber 910 can be configured to facilitate the generation of plasma in plasma processing region 945 in the vicinity of a surface of substrate 925. An ionizable gas or mixture of process gases is introduced via a gas distribution system 940. For a given flow of process gas, the process pressure is adjusted using the vacuum pumping system 950. Plasma can be utilized to create materials specific to a pre-determined materials process, and/or to aid the removal of material from the exposed surfaces of substrate 925. The plasma processing system 900 can be configured to process substrates of any desired size, such as 200 mm substrates, 300 mm substrates, or larger.

Substrate 925 can be affixed to the substrate holder 920 via a clamping system 928, such as a mechanical clamping system or an electrical clamping system (e.g., an electrostatic clamping system). Furthermore, substrate holder 920 can include a heating system (not shown) or a cooling system (not shown) that is configured to adjust and/or control the temperature of substrate holder 920 and substrate 925. The heating system or cooling system may comprise a re-circulating flow of heat transfer fluid that receives heat from substrate holder 920 and transfers heat to a heat exchanger system (not shown) when cooling, or transfers heat from the heat exchanger system to substrate holder 920 when heating. In other embodiments, heating/cooling elements, such as resistive heating elements, or thermo-electric heaters/coolers can be included in the substrate holder 920, as well as the chamber wall of the plasma processing chamber 910 and any other component within the plasma processing system 900.

Additionally, a heat transfer gas can be delivered to the backside of substrate 925 via a backside gas supply system 926 in order to improve the gas-gap thermal conductance between substrate 925 and substrate holder 920. Such a system can be utilized when temperature control of the substrate is required at elevated or reduced temperatures. For example, the backside gas supply system can comprise a two-zone gas distribution system, wherein the helium gas-gap pressure can be independently varied between the center and the edge of substrate 925.

In the embodiment shown in FIG. 9, substrate holder 920 can comprise an electrode 922 through which RF power is coupled to the processing plasma in plasma processing region 945. For example, substrate holder 920 can be electrically biased at a RF voltage via the transmission of RF power from a RF generator 930 through an optional impedance match network 932 to substrate holder 920. The RF electrical bias can serve to heat electrons to form and maintain plasma. In this configuration, the system can operate as a reactive ion etch (RIE) reactor, wherein the chamber and an upper gas injection electrode serve as ground surfaces. A typical frequency for the RF bias can range from about 0.1 MHz to about 90 MHz. RF systems for plasma processing are well known to those skilled in the art.

In an embodiment, a DC power supply 990 can include a variable DC power supply. Additionally, the DC power supply 990 can include a bipolar DC power supply. The DC power supply 990 can further include a system configured to perform at least one of monitoring, adjusting, or controlling the polarity, current, voltage, or on/off state of the DC power supply 990. Once plasma is formed, the DC power supply 990 facilitates the formation of a ballistic electron beam. An electrical filter (not shown) may be utilized to de-couple RF power from the DC power supply 990.

Furthermore, the electrical bias of electrode 922 at a RF voltage may be pulsed using pulsed bias signal controller 931. The RF power output from the RF generator 930 may be pulsed between an off-state and an on-state, for example. Alternately, RF power is applied to the substrate holder electrode at multiple frequencies. Furthermore, impedance match network 932 can improve the transfer of RF power to plasma in plasma processing chamber 910 by reducing the reflected power. Match network topologies (e.g. L-type, π-type, T-type, etc.) and automatic control methods are well known to those skilled in the art.

Gas distribution system 940 may comprise a showerhead design for introducing a mixture of process gases. Alternatively, gas distribution system 940 may comprise a multi-zone showerhead design for introducing a mixture of process gases and adjusting the distribution of the mixture of process gases above substrate 925. For example, the multi-zone showerhead design may be configured to adjust the process gas flow or composition to a substantially peripheral region above substrate 925 relative to the amount of process gas flow or composition to a substantially central region above substrate 925.

Vacuum pumping system 950 can include a turbo-molecular vacuum pump (TMP) capable of a pumping speed up to about 8000 liters per second (and greater) and a gate valve for throttling the chamber pressure. In conventional plasma processing devices utilized for dry plasma etching, a 900 to 3000 liter per second TMP can be employed. TMPs are useful for low pressure processing, typically less than about 50 mTorr. For high pressure processing (i.e., greater than about 90 mTorr), a mechanical booster pump and dry roughing pump can be used. Furthermore, a device for monitoring chamber pressure (not shown) can be coupled to the plasma processing chamber 910.

As mentioned above, the controller 955 can comprise a microprocessor, memory, and a digital I/O port capable of generating control voltages sufficient to communicate and activate inputs to plasma processing system 900 as well as monitor outputs from plasma processing system 900. Moreover, controller 955 can be coupled to and can exchange information with RF generator 930, pulsed bias signal controller 931, impedance match network 932, the gas distribution system 940, vacuum pumping system 950, as well as the substrate heating/cooling system (not shown), the backside gas supply system 926, and/or the electrostatic clamping system 928. For example, a program stored in the memory can be utilized to activate the inputs to the aforementioned components of plasma processing system 900 according to a process recipe in order to perform a plasma assisted process, such as a plasma etch process or CD trimming, on substrate 925.

In addition, the plasma processing system 900 can further comprise an upper electrode 970 to which RF power can be coupled from RF generator 972 through optional impedance match network 974. A frequency for the application of RF power to the upper electrode can range from about 0.1 MHz to about 200 MHz. Additionally, a frequency for the application of power to the lower electrode can range from about 0.1 MHz to about 90 MHz. Moreover, controller 955 is coupled to RF generator 972 and impedance match network 974 in order to control the application of RF power to upper electrode 970. The design and implementation of an upper electrode is well known to those skilled in the art. The upper electrode 970 and the gas distribution system 940 can be designed within the same chamber assembly, as shown. Alternatively, upper electrode 970 may comprise a multi-zone electrode design for adjusting the RF power distribution coupled to plasma above substrate 925. For example, the upper electrode 970 may be segmented into a center electrode and an edge electrode.

Depending on the applications, additional devices such as sensors or metrology devices can be coupled to the plasma processing chamber 910 and to the controller 955 to collect real time data and use such real time data to concurrently control two or more selected integration operating variables in two or more steps involving CD trimming, deposition processes, RIE processes, pull processes, profile reformation processes, and/or pattern transfer processes of the integration scheme. Furthermore, the same data can be used to ensure integration targets including CD trimming width, patterning uniformity (uniformity), pulldown of structures (pulldown), slimming of structures (slimming), aspect ratio of structures (aspect ratio), line edge roughness, line width roughness, cost of ownership, substrate throughput, and the like are achieved.

Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What we claim:

1. A method for critical dimension (CD) trimming of a structure pattern in a substrate, the method comprising:
   providing a substrate in a process chamber of a CD trimming system, the substrate comprising a first structure pattern and an underlying layer, the underlying layer comprising a silicon anti-reflective coating (SiARC) or a silicon oxynitride (SiON) layer, an optical planarization layer, and a target patterning layer;
   performing an optional CD trimming process of the first structure pattern;
   performing a series of processes to open the SiARC or SiON layer;
   performing a first comparing of, after opening the SiARC or SiON layer, a current CD of the first structure pattern with a target CD trimming width for the first structure pattern;
   performing additional CD trimming of the first structure pattern in accordance with the first comparing;
   performing a series of processes to open the optical planarization layer, the series of processes generating a final structure pattern;
   performing a second comparing of, after opening the optical planarization layer, a current CD of the final structure pattern with a target CD trimming width for the final structure pattern; and
   performing additional CD trimming of the final structure pattern in accordance with the second comparing;
   wherein the optical planarization layer is one of a group comprising an advance patterning film (APF), an organic dielectric layer (ODL) or a spin-on hardmask (SOH) layer.

2. The method of claim 1 further comprising:
   transferring the final pattern into the target patterning layer of the substrate;
   concurrently controlling two or more selected operating variables of one or more processes of the group comprising the SiARC/SiON open process, the optical planarization layer open process, and/or the final transfer process in order to achieve integration objectives;
   wherein the first structure pattern is a resist pattern generated using a lithography process.

3. The method of claim 2, wherein the integration objectives comprise the target CD trimming width for the first structure pattern, the target CD trimming width for the final structure pattern, target line edge roughness (LER), target line width roughness (LWR), target substrate throughput, and/or target cost of ownership.

4. The method of claim 3, wherein the two or more selected operating variables comprise flowrate of a fluorocarbon gas used in a CD trimming process, length of time of fluorocarbon gas exposure, chamber pressure, chamber temperature, and selected one or more stages in an integration scheme where CD trimmings are performed.

5. The method of claim 4, wherein the two or more selected operating variables include flowrate of a fluorocarbon gas and length of time of the fluorocarbon gas exposure.

6. The method of claim 5, wherein the flowrate of the fluorocarbon gas is 2-6 sccm.

7. The method of claim 6, wherein the fluorocarbon gas is C4F8 and the length of time of fluorocarbon gas exposure is in a range from 5 to 65 seconds.

8. The method of claim 7, wherein the APF, ODL or SOH open is performed using a gas mixture of 180 sccm of CO2 and 400 sccm of Ar.

9. The method of claim 8, wherein the gas mixture includes a passivant gas such as HBr or Carbonyl Sulfide (COS).

10. The method of claim 9, wherein the target LER is in the range from 2.0 to 2.5 nm and the target LWR is in the range from 2.6 to 3.4 nm.

11. A method for critical dimension (CD) trimming of a structure pattern in a substrate, the method comprising:
    providing a substrate in a process chamber of a CD trimming system, the substrate comprising a first structure pattern and an underlying layer, the underlying layer comprising a silicon anti-reflective coating (SiARC) or a silicon oxynitride (SiON) layer, an optical planarization layer, and a target patterning layer;
    generating a CD trimming strategy for achieving integration objectives;
    performing an optional CD trimming process of the first structure pattern in response to determining that the optional CD trimming process is specified by the CD trimming strategy;
    performing a series of processes to open the SiARC or SiON layer;
    performing additional CD trimming in accordance with a first CD trimming width specified by the CD trimming strategy;
    performing a series of processes to open the optical planarization layer, the series of processes generating a final structure pattern; and
    performing additional CD trimming in accordance with a second CD trimming width specified by the CD trimming strategy;
    wherein the planarization layer is one of a group comprising an advance patterning film (APF), an organic dielectric layer (ODL) or a spin-on hardmask (SOH) layer.

12. The method of claim 11 further comprising:
    transferring the final pattern into the target patterning layer of the substrate;
    concurrently controlling two or more selected operating variables of one or more processes of the group comprising the SiARC/SiON open, the APF/ODL/SOH open, and/or the final transfer process in order to achieve integration objectives;

wherein the first structure pattern is a resist pattern generated using a lithography process.

13. The method of claim 12, wherein the integration objectives comprise the first and second target CD trimming widths, target line edge roughness (LER), target line width roughness (LWR), target substrate throughput, and/or target cost of ownership.

14. The method of claim 13, wherein two or more selected operating variables comprise flowrate of a fluorocarbon gas used in a CD trimming process, length of time of fluorocarbon gas exposure, chamber pressure, chamber temperature, and selected one or more stages of the integration scheme where CD trimmings are performed.

15. The method of claim 14, wherein the two or more selected operating variables include flowrate of a fluorocarbon gas and length of time of the fluorocarbon gas exposure.

16. The method of claim 15, wherein the flowrate of the fluorocarbon gas is 2-6 sccm.

17. The method of claim 16, wherein the fluorocarbon gas is C4F8 and the length of time of fluorocarbon gas exposure is in a range from 5 to 65 seconds.

18. The method of claim 17, wherein the APF, ODL or SOH open is performed using a gas mixture of 180 sccm of CO2 and 400 sccm of Ar.

19. The method of claim 18, wherein the gas mixture includes a passivant gas such as HBr or Carbonyl Sulfide (COS).

20. The method of claim 19, wherein the target LER is in the range from 2.0 to 2.5 nm and the target LWR is in the range from 2.6 to 3.4 nm.

21. The method of claim 11, wherein generating the CD trimming strategy includes selecting stages where CD trimming can be performed and wherein the stages include:

(1) a first stage occurring after providing the substrate with the first structure pattern;

(2) a second stage occurring during or after the SiARC/SiON open process; and/or (3) a third stage occurring during or after the SiON APF/ODL/SOH open process.

22. The method of claim 21, wherein the CD trimming strategy includes:

using any combination of the first, second, and/or third stages where CD trimming can be performed; and/or using a fixed or variable flowrate of a CD trimming gas; and/or using a fixed or variable length of time of exposure to the CD trimming gas.

23. The method of claim 22, wherein online in situ metrology devices measure a current CD width of the first or final structure pattern and adjust the trimming gas flowrate or length of time of exposure to the CD trimming gas based on a comparison of the current CD width to the target CD trimming width.

* * * * *